(12) United States Patent
Rasmussen et al.

(10) Patent No.: US 7,369,386 B2
(45) Date of Patent: May 6, 2008

(54) OVERCURRENT PROTECTION FOR SOLID STATE SWITCHING SYSTEM

(75) Inventors: Eric G. Rasmussen, Waunakee, WI (US); John P. Thurk, Madison, WI (US); Eric W. Suomi, Madison, WI (US)

(73) Assignee: Electronic Theatre Controls, Inc., Middleton, WI (US)

( * ) Notice: Subject to any disclaimer, the term of this patent is extended or adjusted under 35 U.S.C. 154(b) by 273 days.

(21) Appl. No.: 11/048,123

(22) Filed: Jan. 31, 2005

(65) Prior Publication Data

US 2005/0185353 A1 Aug. 25, 2005

Related U.S. Application Data

(63) Continuation-in-part of application No. 10/457,067, filed on Jun. 6, 2003, now Pat. No. 6,849,943.

(51) Int. Cl.
*H02H 9/08* (2006.01)

(52) U.S. Cl. ............... 361/93.9; 315/294; 318/135

(58) Field of Classification Search ........... 361/93.9, 361/93.1
See application file for complete search history.

(56) References Cited

U.S. PATENT DOCUMENTS

| | | | | |
|---|---|---|---|---|
| 4,497,031 A | * | 1/1985 | Froehling et al. | 700/276 |
| 4,626,954 A | | 12/1986 | Damiano et al. | 361/97 |
| 5,045,774 A | | 9/1991 | Bromberg | 323/322 |
| 5,424,618 A | | 6/1995 | Bertenshaw et al. | 315/324 |
| 5,444,592 A | * | 8/1995 | Shimizu et al. | 361/21 |
| 5,500,575 A | | 3/1996 | Ionescu | 315/307 |

(Continued)

FOREIGN PATENT DOCUMENTS

WO        WO 00/52813 A        9/2000

(Continued)

OTHER PUBLICATIONS

Freescale Semiconductor Inc. (Motorola); Hybrid flash solution; date unknown; prior to present invention.

(Continued)

*Primary Examiner*—Robert L. Deberadinis
*Assistant Examiner*—Luis E. Román
(74) *Attorney, Agent, or Firm*—Greer, Burns & Crain, Ltd.

(57) ABSTRACT

Current sensing resistors are connected directly to output terminals of MOSFETs forming the series switching stage of a PWM sinewave dimmer. An analog sensed current signal is coupled through an EMI resistant current link to comparators that provide an overcurrent indication in response to an overcurrent condition. A logic circuit overrides PWM control signals from a programmable controller, and operates drivers to render the series switching stage nonconductive and to render a clamp switching stage conductive until after the end of the current PWM duty cycle power on segment. The logic circuit sends an overcurrent signal through an optocoupler to an input of the programmable controller. The input of the controller is polled at a clock frequency for overcurrent signals and if the count exceeds a limit in any half cycle, or a maximum sum in sixteen half cycles of the AC supply, the series switching stage is rendered nonconductive and the clamp switching stage is rendered conductive pending a reset signal.

18 Claims, 5 Drawing Sheets

U.S. PATENT DOCUMENTS

| | | | |
|---|---|---|---|
| 5,530,788 A * | 6/1996 | Saijima | 388/811 |
| 5,714,847 A | 2/1998 | Lindauer et al. | 315/307 |
| 5,770,928 A | 6/1998 | Chansky et al. | 315/362 |
| 5,818,201 A * | 10/1998 | Stockstad et al. | 320/119 |
| 5,949,197 A | 9/1999 | Kastner | 315/291 |
| 6,194,856 B1 * | 2/2001 | Kobayashi et al. | 318/432 |
| 6,346,778 B1 | 2/2002 | Mason et al. | 315/291 |
| 6,407,515 B1 * | 6/2002 | Hesler et al. | 315/294 |
| 6,441,484 B2 * | 8/2002 | Koyama et al. | 257/724 |
| 6,614,195 B2 * | 9/2003 | Bushey et al. | 318/135 |
| 6,849,943 B2 * | 2/2005 | Thurk et al. | 257/712 |
| 6,970,339 B2 * | 11/2005 | Wong et al. | 361/93.1 |

FOREIGN PATENT DOCUMENTS

| | | | |
|---|---|---|---|
| WO | WO 03/067357 A | 8/2003 | |

OTHER PUBLICATIONS

Freescale Semiconductor Inc. (Motorola); 56F803 Evaluation Module Hardware User's Manual, Rev. 4; Jun. 3, 2003.

Ohmite Mfg. Co.; Data Sheet for Metal Plate Current Sense Resistors; Surface Mount Metal Alloy Resistor 60S Series; date unknown; prior to present invention.

Philips Semiconductors; Data Sheet for 74HC00; 74HCT00 Quad 2-input NAND gate; Jun. 30, 2003.

Fairchild Semiconductor Corporation; Data Sheet for High Speed-10 MBit/s Logic Gate Optocouplers; Jul. 9, 2001.

Texas Instruments; Data Sheet for Single 9-A High Speed Low-Side MOSFET Driver with Enable; Sep. 2002.

Extended European search report for Application No. 06270007.5-2207; Dated Jun. 6, 2006.

* cited by examiner

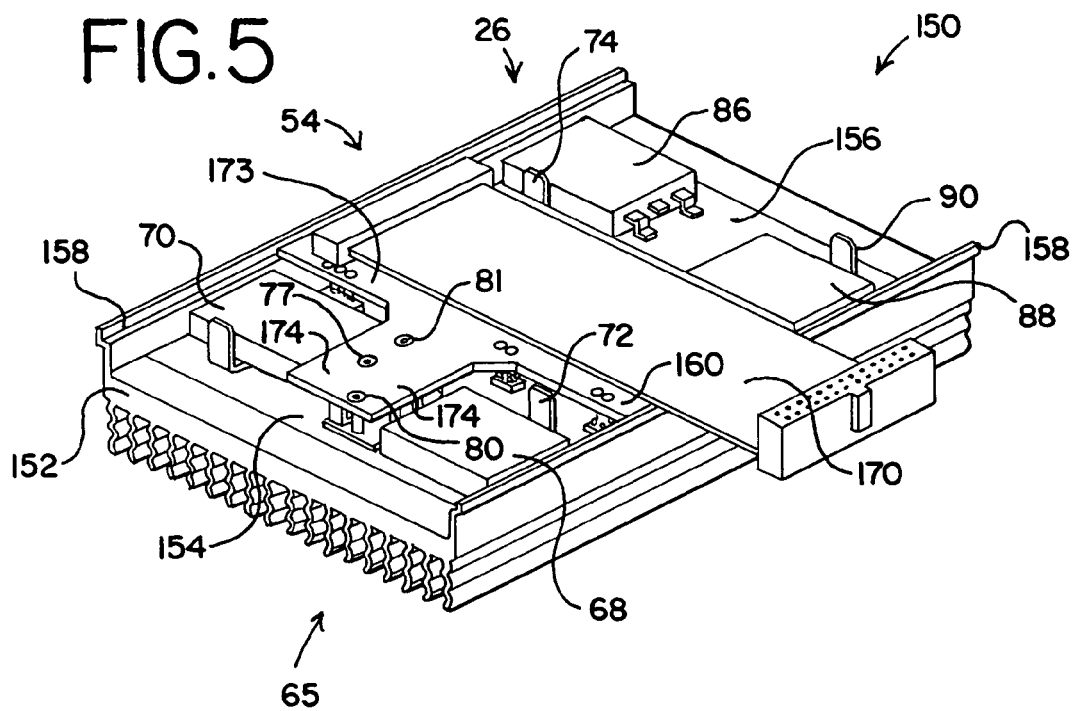

OVERCURRENT PROTECTION FOR SOLID STATE SWITCHING SYSTEM

CROSS REFERENCE TO RELATED APPLICATION

This is a continuation-in-part of U.S. patent application Ser. No. 10/457,067 filed on Jun. 6, 2003, issued on Feb. 1, 2005, as U.S. Pat. No. 6,849,943.

FIELD OF THE INVENTION

The present invention relates to active overcurrent protection of solid state switches such as those used for pulse width modulation in sinewave dimmers.

DESCRIPTION OF THE PRIOR ART

High frequency, high power solid state switches, namely metal oxide semiconductor field effect transistors (MOSFETs) and insulated gate bipolar transistors (IGBTs), are used in switching systems for switch mode or pulse width modulation (PWM) power supplies. One application for such systems is lamp dimmers. In this application, a lamp is provided with power by a dimmer so that the lamp can be operated at variable, selected light intensity levels. For example, luminaires for theatrical, architectural and other applications are often provided with operating power by dimmers.

Phase angle dimmers for this purpose are well known, and typically include solid state switches such as SCRs for interconnecting an AC power source to a lamp load. AC voltage from the source is sinusoidal. A phase control circuit renders a solid state switch conductive at a point during a half cycle of the sinusoid, the point being selected to supply to the lamp a lamp operating pulse having a desired quantity of power in order to produce a desired level of light intensity. Switching operations are performed by the SCRs in a phase angle dimmer at a low frequency, for example once or twice in each power supply cycle of fifty or sixty cycles per second.

With a phase angle dimmer, the abrupt low frequency switching during the half cycles of the power supply and resultant abrupt amplitude changes in the current supplied to a luminaire can cause problems of electrical noise and mechanical filament noise, requiring extensive filtering. In some dimmer applications, even with filtering, the noise incident to phase angle dimming can be unacceptable. In addition, phase angle dimmers have the disadvantage that they can reflect harmonic distortion into the mains power supply.

To avoid the potential problems with low frequency phase angle dimming it has been proposed to use pulse width modulation (PWM) techniques with solid state switches operating at a higher frequency. With this type of dimmer power supply, known as a switch mode or PWM power supply, light intensity is varied by changing the pulse width modulation duty cycle. The output, after filtering in an output load filter, can have a shape similar to the power supply wave form with attenuated amplitude. Typically both the input power supply and the attenuated output are sine waves. For this reason, pulse width modulation dimmers are also described as sinewave dimmers.

High frequency, high power switches (MOSFETs and IGBTs) used in dimmers and other applications are subject to damage resulting from excess current for even a short period of time. For example, mistakes in wiring during installation of a dimmer system, or other mishaps, can result in a short circuit or a low resistance circuit across the output of the switching system. The resulting high current can destroy solid state switches in a very short period of time. Moreover, defects in the load supplied by the switching system can cause excess currents that, even if smaller than would result from a short circuit, can damage solid state switches.

Overcurrent protection schemes that have been used for SCR phase angle dimmers are not satisfactory for high frequency, high power PWM solid state switches. In the past, circuit breakers have been used in an attempt to protect switching systems from overcurrent damage. However, circuit breakers are slow acting, electromechanical devices that cannot react fast enough to discontinue current through solid state switches before they are damaged by excess current. Another approach that has been used in the past is to sense current at the load or at the power source, and use feedback or the like to discontinue operation of solid state switches in the event of excess current. Such systems have been slow in response, erratic in operation, and have not been able to prevent overcurrent damage in high power, high frequency switching systems.

Although overcurrent detection with fast response might be achieved by sensing current directly at the solid state switches, there are serious obstacles to this approach. High frequency, high current switching results in a very high noise electrical environment, making accurate and sensitive current detection very difficult. To avoid nuisance false shutdowns, it can be necessary to set the current threshold so high that solid state switch overcurrent protection is compromised. Alternatively, if the current threshold is set low enough for effective overcurrent protection in all circumstances, nuisance interruptions can result. In addition, even if overcurrent is successfully detected, there needs to be a way to interrupt operation of the overloaded switches quickly enough to avoid damage. In a dimmer application, the overcurrent protection system must be able to distinguish between normal cold lamp filament inrush currents and potentially damaging overcurrent events.

SUMMARY OF THE INVENTION

A primary object of the present invention is to provide improved overcurrent protection for solid state switching systems such as switching power supplies having high power, high frequency solid state switches. Other objects are to provide overcurrent protection that senses output current directly at the solid state switch and quickly interrupts current flow in response to an overcurrent condition; to provide overcurrent protection that is impervious to transient anomalies; to provide overcurrent that uses both hardware (or electronic) protection and programmable(or software) protection; to provide a power module assembly that is optimized for overcurrent protection in the high EMI environment of high speed power switching; to provide software based methods for overcurrent protection implemented efficiently and effectively in a programmable controller; and to provide overcurrent protection that overcomes problems with overcurrent systems used in the past.

In brief, in accordance with the invention there is provided a PWM switching power supply with overcurrent protection. The power supply receives AC power from a power source and provides output current for powering a load. The PWM switching power supply has a series switching section with a series solid state switch in series with the load, and a clamp switching section shunting the load. A programmable controller supplies a PWM control signal having a duty cycle with power on segments. A driver system receives the PWM control signal and provides PWM operating signals for alternate conduction of the series and clamp switching sections. A current sensing resistor is connected to the series solid state switch and senses output current during power on cycles. A comparator connected to the current sensing resistor compares sensed output current with a threshold value and provides an overcurrent indication if the output current exceeds the threshold value in a PWM power on duty cycle segment. A logic circuit overrides the driver system and renders the series switching section nonconductive and renders the clamp switching section conductive in response to the overcurrent indication. An optocoupler connected to the logic circuit provides an overcurrent signal in response to the overcurrent indication.

BRIEF DESCRIPTION OF THE DRAWING

The present invention together with the above and other objects and advantages may best be understood from the following detailed description of the preferred embodiment of the invention illustrated in the drawings, wherein:

FIG. 5 is an isometric view of a power module package for the dimmer, including the power switching and gate driver stages;

FIG. 6 is a top plan view of the power module package;

FIG. 7 is a top plan view like FIG. 6 with the gate driver board removed;

DETAILED DESCRIPTION OF THE PREFERRED EMBODIMENT

Figure 1:
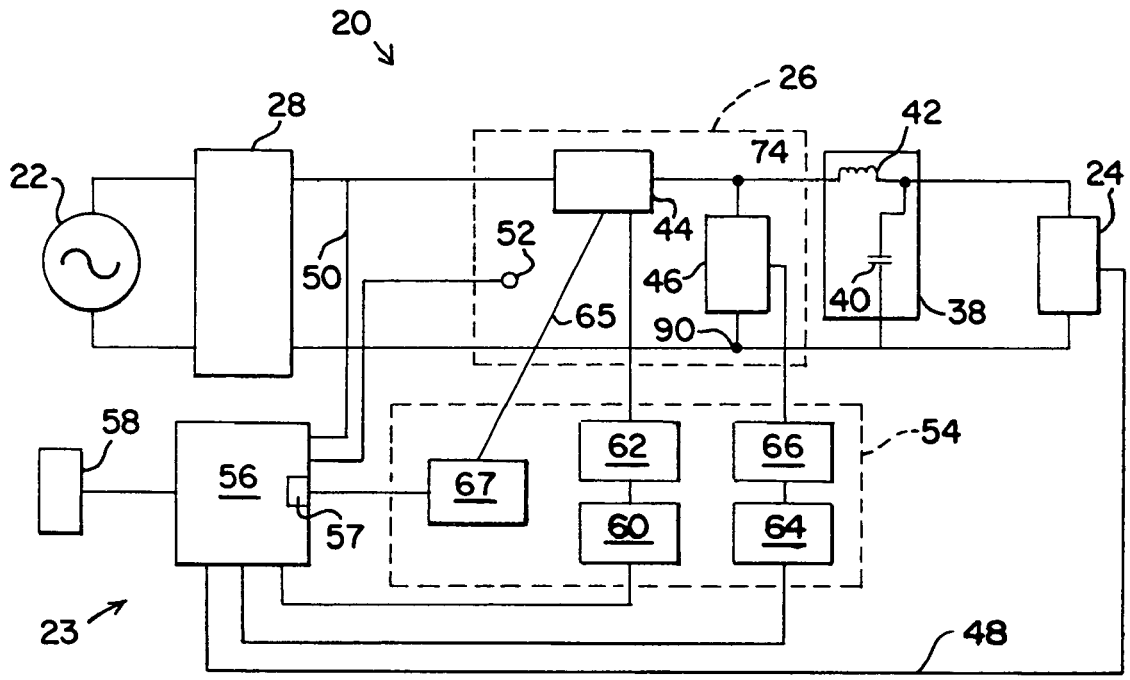
FIG. 1 is a block diagram of a sinewave dimmer having a solid state switching system protected by an overcurrent protection system in accordance with the present invention.

Having reference now to the drawing, FIG. 1 is a simplified block diagram of a sinewave dimmer designated as a whole by the reference character 20 having a solid state power switching stage 26. In accordance with the present invention, the switching stage 26 is protected by an overcurrent protection system constructed in accordance with the principles of the present invention and generally designated as 23.

The dimmer 20 is connected to a conventional mains power supply 22 providing a sinusoidal alternating current power supply waveform of, for example, 60 hertz and nominal 120 volts ac. The dimmer 20 provides output power to a load 24. In a typical application, the load 24 may be a resistive load such as an incandescent lamp, or a reactive load such as a power supply for a gas discharge lamp or fluorescent lamp. The power switching stage 26 uses pulse width modulation (PWM) to attenuate input power and supply reduced output power to the load.

Figure 2:
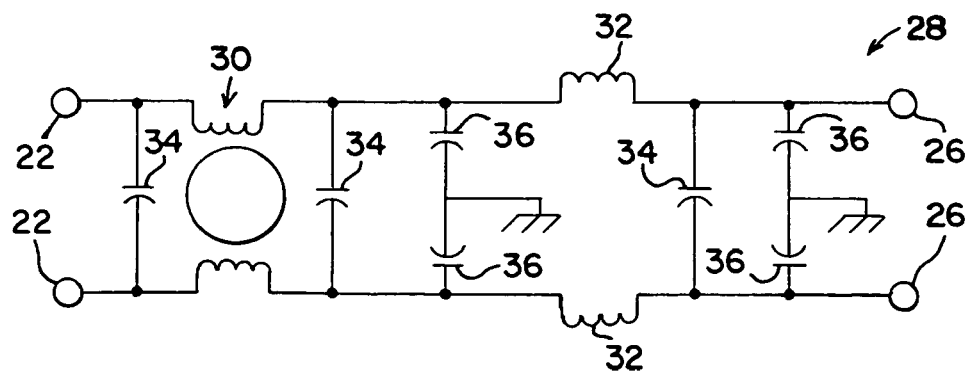
FIG. 2 is a schematic diagram of the input line filter of the dimmer.

An input line filter 28 filters out noise that may be present on the power supply signal and assures the supply of clean ac power to the power switching stage 26. In addition the input line filter 28 filters out switching noise from the power switching stage 26 and prevents the conduction of noise back to the power supply 22. Preferably the input line filter 28, as seen in FIG. 2, is a high order line filter including a common mode inductor 30, differential mode inductors 32, line to neutral differential mode X capacitors 34 and line/neutral to earth ground common mode Y capacitors 36.

The PWM switching operates at a high frequency, for example over 20,000 hertz, 50,000 hertz being presently preferred. Output load filter 38 filters out the PWM switching frequency of the power switching stage 26 and reconstructs the output voltage waveform into a line frequency, variable amplitude sinewave with the same frequency as the power supply sinewave. Preferably, the output load filter typically may include bypass capacitance represented by capacitor 40. The main component of the load filter is an output inductor 42 in series with the load 24 that stores energy and smoothes the output waveform. In order to accommodate a wide range of load values, preferably the inductor 42 is a swinging inductor. For example, the inductor 42 can have a reactance of 10 mH at an output current of 0.25 amp, a reactance of 1 mH at an output current of 10 amps and a reactance of 0.5 mH at an output current of 20 amps.

The power switching stage 26 includes a series switching section 44 connected in series between the power supply 22 and the series connected load 24 and load inductor 42. The power switching stage 26 also includes a clamp switching section 46 shunted across the series connected load 24 and load inductor 42. The series switching section 44 is alternately rendered conductive and nonconductive at a high frequency with a PWM signal having a duty cycle chosen to provide a desired output power level. The clamp switching section 46 is alternately rendered nonconductive and conductive by the inverse of the PWM signal so that the damp switching section 46 is nonconductive when the series switching section 44 is conductive, and so that the clamp switching section 46 44 is conductive when the series switching section 44 is nonconductive. The power switching stage 26 preferably operates at a high frequency of at least 20 kilohertz, with about 50 kilohertz being preferred.

A microprocessor based programmable controller 56 controls the operation of the series and clamp switching sections 44 and 46. The controller 56 includes or has access to program and data memory and is programmable by instructions loaded into program memory in the form of data received from a data input-output bus or device 58. The controller 56 includes a counter 57 used in the overcurrent protection process as described below. One example of a programmable controller suitable for the practice of the present invention is a Model 56F803 hybrid digital signal processor (DSP) and controller sold by Freestyle Semiconductor, Inc. (Motorola) and described in 56F803 Evaluation Module Hardware User's Manual, Rev. 4, Jun. 3, 2003 incorporated herein by reference.

The controller 56 under software control supplies high frequency PWM series switching control signals to the series switching section 44 through an opto-isolation circuit 60 and a driver circuit 62. Similarly, the controller 56 under software control supplies high frequency inverse PWM series switching control signals to the clamp switching section 46 through an opto-isolation circuit 64 and a driver circuit 66. The isolation circuits 60 and 64, and the driver circuits 62 and 66 are incorporated in a gate driver stage 54.

The controller 56 receives feedback signals through line 48 indicating the load voltage and the load current. These signals can be used under software control to adjust the PWM and inverse PWM control signals in order to accurately regulate the output load signal. A further disclosure of the construction and operation of components of the dimmer 20, including the control of the series and clamp switching sections 44 and 46 of the power switching stage 26 by the controller 56 may be found in U.S. patent application Ser. No. 10/971,682, filed on Oct. 21,2004, incorporated herein by reference.

On line 50 the controller 56 receives a feedback signal indicating the power supply voltage. This signal is used under software control for power signal zero crossing detection, and for adjusting the PWM and inverse PWM control signals in order to accurately regulate the output load signal. A sensor 52 associated with the power switching stage 26 provides an operating temperature feedback signal that may be used, for example, for excess temperature power decrease or shutoff capability.

The overcurrent protection system 23 includes current sensors described below associated with the series switching section 44. Signals corresponding to sensed current are coupled through a low resistance, interference resistant link 65 to an overcurrent detection logic section 67 located in the gate driver stage 54. When solid state switching devices of the series switching section 44 are in an overcurrent state, the logic section 67 provides overcurrent signals to the programmable controller 56. The controller 56 performs a routine for preventing overcurrent damage to the power switching stage 26 by rendering the series switching section 44 nonconductive and rendering the clamp switching section 46 conductive.

Figure 3:
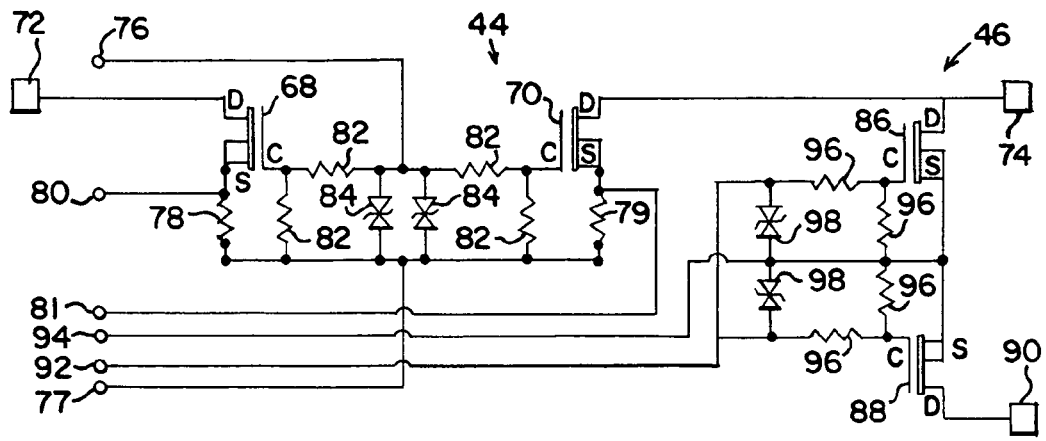
FIG. 3 is a schematic diagram of the power switching stage of the dimmer.

The power switching stage 26 is shown in more detail in FIG. 3. The series switching section 44 includes a complementary pair of MOSFETs 68 and 70 functioning as a high speed, high power, bidirectional switch connected in series between a power supply terminal 72 connected to the line input filter 28 and a load output terminal 74 connected to the inductor 42 of the output load filter 38. The MOSFETs 68 and 70 are simultaneously rendered conductive or nonconductive by a high frequency PWM control signal supplied by the controller 56 and applied through opto-isolator circuit 60 and driver circuit 62 across a gate control input terminal 76 and a ground terminal 77.

Current sensing resistors 78 and 79 are connected between ground and the source terminals of the MOSFETs 68 and 70 to provide signals to terminals 80 and 81 for transmission across the link 65 to the logic section 67. The resistors 78 and 79 are connected directly to the output terminals of MOSFETs 58 and 70, in that there are no circuit components separating the resistors and the output terminals. Resistors 82 serve as bleeder resistors and stabilizing series resistors connected to the gate terminals of the MOSFETs 68 and 70. Bidirectional zeners 84 provide transient protection.

The clamp switching section 46 includes a complementary pair of MOSFETs 86 and 88 functioning as a high speed, high power, bidirectional switch connected in series between the load output terminal 74 and a load neutral terminal 90. The MOSFETs 86 and 88 are simultaneously rendered nonconductive or conductive by a high frequency inverse PWM control signal supplied by the controller 56 and applied through opto-isolator circuit 64 and driver circuit 66 across a gate control input terminal 92 and a ground terminal 94. Resistors 96 function as bleeder resistors and stabilizing series resistors connected to the gate terminals of the MOSFETs 86 and 88. Bidirectional zeners 98 provide transient protection.

MOSFETs are the preferred type of high power solid state switching devices for the illustrated dimmer circuit 20 because of their superior high speed and high power switching characteristics. In addition, the bidirectional nature and fast switching speeds of MOSFETs make them preferable for a dimmer having both series and clamp high speed switching. However in other applications, IGBTs, might be used as high frequency, high power solid state switches, and the principles of the present invention can be applied to such other applications.

Figure 4:
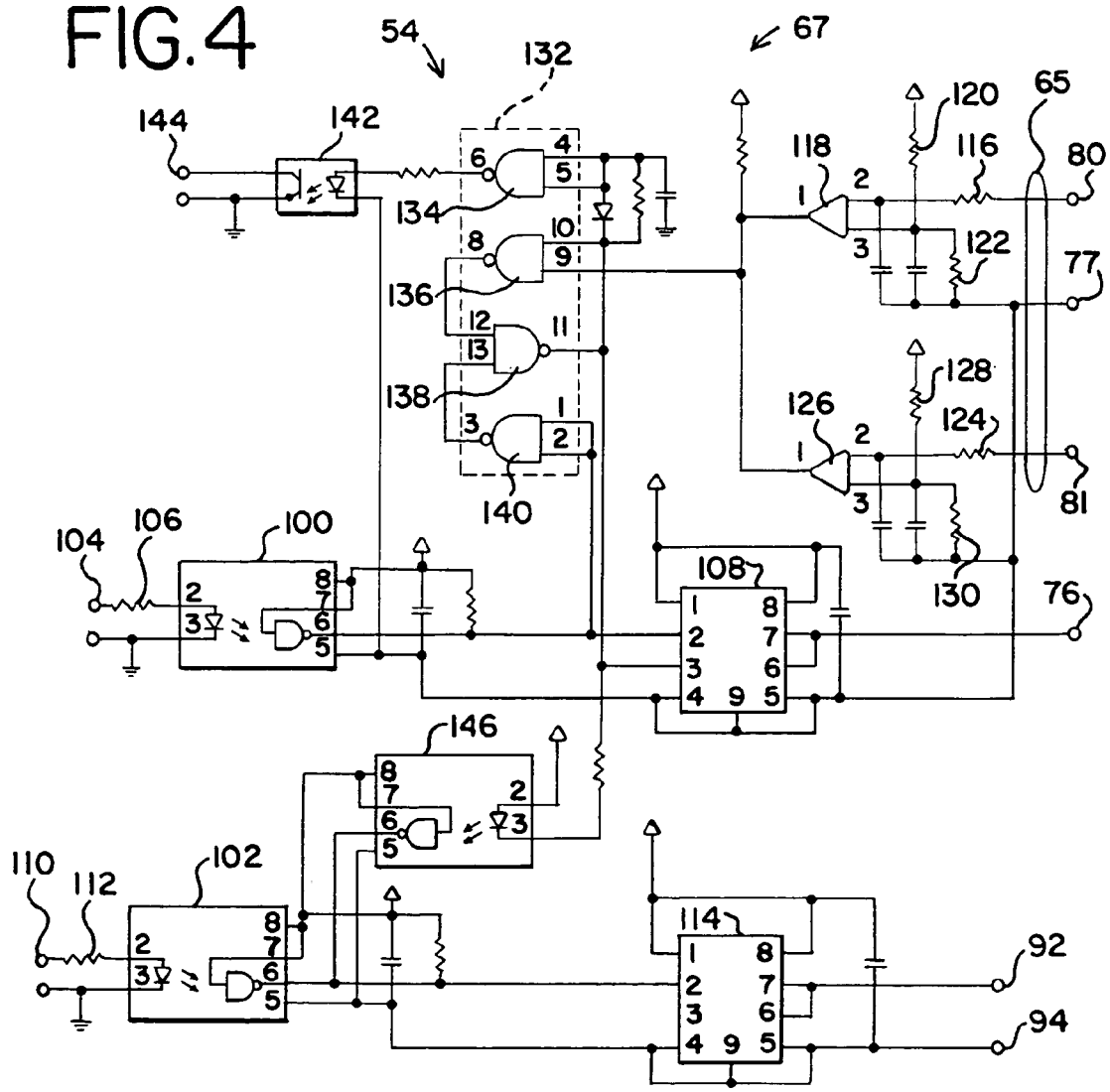
FIG. 4 is a simplified schematic diagram of the gate driver stage of the dimmer, including the overcurrent protection logic section.

Referring now to FIG. 4, the gate driver stage 54 of the dimmer 20, including the overcurrent protection logic section 67 is schematically illustrated. The schematic diagram of FIG. 4 is simplified, in that it does not include elements of the driver stage 54, such as power supplies, that are not required for a full understanding of the present invention.

The programmable controller 56 provides PWM control signals to the driver stage 54 in order to operate the series and clamp switching sections 44 and 46 of the power switching stage 26 with a PWM duty cycle corresponding to the desired output power level to be supplied to the load 24. In the illustrated embodiment, the opto-isolation circuits 60 and 64 include logic gate optocouplers 100 and 102, such as Fairchild Semiconductor model 6N137 integrated circuit (IC) optocouplers.

During each power on segment of the PWM duty cycle, a high signal from the programmable controller 56 is coupled from input terminal 104 through a resistor 106 to terminal or pin 2 of optocoupler 100 (hereinafter, e.g., pin 100-2). The light emitting diode (LED) of the optocoupler 100 is energized, and as a result, output pin 100-6 of the optocoupler 100 is low. This output pin 100-6 is connected to the input pin 108-2 of a MOSFET driver IC 108, such as a Texas Instruments Model UCC37321 driver. When input pin 108-2 is low, output pin 108-7 is high, and the signal provided to the gate control terminal 76 renders the MOSFETs 68 and 70 of the power switching stage conductive.

During each power off segment of the PWM duty cycle, a low signal from the programmable controller 56 is coupled from input terminal 104 through resistor 106 to pin 100-2 of optocoupler 100. The light emitting diode of the optocoupler 100 is not energized, and as a result, output pin 100-6 of the optocoupler 100 and input pin 108-2 of MOSFET driver 108 are high. When input pin 108-2 is high, output pin 108-7 is low, and the signal provided to the gate control terminal 76 renders the MOSFETs 68 and 70 of the power switching stage nonconductive.

The operation of the clamp switch section 46 is similar. During each power off segment of the PWM duty cycle, a high signal from the programmable controller 56 is coupled from input terminal 110 through a resistor 112 to pin 102-2 of the optocoupler 102. The light emitting diode of the optocoupler 102 is energized, and as a result, output pin 102-6 of the optocoupler 102 is low. This output pin 102-6 is connected to the input pin 114-2 of a MOSFET driver 114. When input pin 114-2 is low, output pin 114-7 is high, and the signal provided to the gate control terminal 92 renders the MOSFETs 86 and 88 of the clamp switching stage conductive.

During each power on segment of the PWM duty cycle, a low signal from the programmable controller 56 is coupled from input terminal 110 through resistor 112 to pin 102-2 of optocoupler 102. The light emitting diode of the optocoupler 102 is not energized, and as a result, output pin 102-6 of the optocoupler 100 and input pin 114-2 of MOSFET driver 114 are high. When input pin 114-2 is high, output pin 114-7 is low, and the signal provided to the gate control terminal 92 renders the MOSFETs 86 and 88 of the power switching stage nonconductive.

It is preferred that the programmable controller 56 provides a dead time interval between each power on and power off segment of the PWM duty cycle, as described in pending U.S. patent application Ser. No. 10/971,682, filed Oct. 21, 2004, and incorporated by reference above.

The load current responsive signals from the current sensing resistors 78 and 79 are coupled through the link 65 to the overcurrent detection logic section 67. Resistor 78 is used to sense current during each positive half cycle of the power supply waveform and resistor 79 is used to sense current during each negative half cycle of the power supply waveform. The overcurrent detection logic section 67 performs two functions. It provides an overcurrent signal to the programmable controller 56 if the current flowing in the series switching section 44 exceeds a threshold value. In addition, if the threshold is exceeded, the overcurrent detection logic section 67 forces an immediate, temporary shutdown of the series switching section 44 and immediate, temporary operation of the clamp switching section 46.

During positive half cycles, the signal representative of sensed current is coupled through terminal 80 and a resistor 116 to input 118-2 of a comparator 118. The overcurrent detection threshold is determined by a voltage divider including resistors 120 and 122 applying a threshold voltage to pin 118-3 of the comparator 118. During negative half cycles, the signal representative of sensed current is coupled through terminal 81 and a resistor 124 to input 126-2 of a comparator 126. The overcurrent detection threshold is determined by a voltage divider including resistors 128 and 130 applying a threshold voltage to pin 126-3 of the comparator 126.

The threshold value is set low enough to provide reliable protection of the series switching MOSFETs 68 and 70, and high enough to avoid nuisance, false shutdowns. For example, the illustrated embodiment of the invention is implemented in a dimmer for incandescent lamps rated at up to twenty amps. During cold filament energization, the inrush current can briefly be ten times the normal operating current, or two hundred amps. The voltage divider resistors 120, 122,128 and 130 are selected to provide a threshold sensed current value to comparator input pins 118-3 and 126-3 corresponding to two hundred five amps to provide a small margin of error, and to detect an overcurrent condition if sensed current exceeds the threshold value.

The overcurrent detection logic section 67 includes an array 132 of four NAND gates 134, 136,138 and 140. The NAND gate array may be a Philips Semiconductor single package model 74HC00 quad NAND gate. The outputs 118-1 and 126-1 of the comparators 118 and 126 are high as long as no overcurrent condition is sensed and the voltage at inputs 118-2 and 126-2 are lower than the threshold voltages at inputs 118-3 and 126-3. As a result, pin 136-9 of gate 136 is high in the absence of an overcurrent condition. The enable pin 108-3 of the series MOSFET driver 108 is normally pulled high by an internal resistor circuit so that input 136-10 of gate 136 is high. As a result, output pin 136-8 is low, along with input pin 138-12 of gate 138.

Gate 140 provides a signal that is the inverse of the PWM signal provided by the programmable controller 56 through the optocoupler 100. Ganged inputs 140-1 and 140-2 are connected to output pin 100-6 of the optocoupler 100. During power on segments of the PWM duty cycle, when the output pin 100-6 of the optocoupler 100 is low, the gate inputs 140-1 and 140-2 are also low. As a result, the gate output pin 140-3 and the input pin 138-13 of gate 138 are high.

Because input pin 138-12 is low and input pin 138-13 is high, the output pin 138-11 of gate 138 is high. Input pins 134-4 and 134-5 are also high, and the output pin 134-6 is low. Overcurrent signals are coupled from the output pin 134-6 of the NAND gate array 132 to the programmable controller by an optocoupler 142 and output terminal 144. When output pin 134-6 is low, the LED of the optocoupler 142 is not energized, and no overcurrent output signal is present at output terminal 144.

When an overcurrent is sensed in the series switching section 144, the overcurrent detection logic section 67 performs a latching and reset function. An overcurrent output signal is provided at the beginning of a sensed overcurrent condition. Regardless of the duration of the sensed overcurrent condition, the overcurrent output signal is latched and maintained throughout the remaining portion of the power on segment of the PWM duty cycle. This stabilizes the operation of the overcurrent protection system 23 in the event of transient overcurrent conditions. Following the power on segment during which an overcurrent condition is sensed, the overcurrent detection logic section 67 is reset to its initial condition for independent overcurrent sensing during the next power on segment of the PWM duty cycle.

When an overcurrent is sensed in the series switching section by sensing resistor 78 during a positive power supply half cycle, the voltage at input 118-2 of comparator 118 rises to the threshold value at input pin 118-3 and the output 118-1 goes low to provide an overcurrent indication. Similarly, when an overcurrent is sensed in the series switching section by sensing resistor 79 during a negative power supply half cycle, the voltage at input 126-2 of comparator 126 rises to the threshold value at input pin 126-3 and the output 126-1 goes low to provide an overcurrent indication. In either case, input pin 136-9 of gate 136 is low. Because input pin 136-10 is high at the beginning of the sensed overcurrent condition, the output 136-8 goes high, along with input 138-12 of gate 138.

Input 138-13 is high throughout the power on segment of the PWM duty cycle, and the output 138-11 goes high. As a result, input 136-10 is driven from high to low. Gates 138 and 136 act as a flip-flop and are now latched in state until the end of the present power on segment of the PWM duty cycle. During this latched state, the low output 138-11 of gate 138 holds the inputs 134-4 and 134-5 of gate 134 low. Output 134-6 is high, and the LED of the optocoupler 142 is energized. An overcurrent signal is provided to the programmable controller 56 through the output terminal 144.

In order to prevent overcurrent damage to the series switching MOSFETs 68 and 70, when an overcurrent condition is sensed, the PWM control signals are overridden and the MOSFETs 68 and 70 are immediately rendered nonconductive. When the output 138-11 is driven from high to low, the enable pin 108-3 of the MOSFET driver IC 108 is also placed in a low state. As a result, the output pin 108-7 of the driver 108 is low, and the signal provided to the gate control terminal 76 renders the MOSFETs 68 and 70 of the power switching stage nonconductive.

In addition, at the onset of an overcurrent condition, the PWM control signals for the clamp switching MOSFETs 86 and 88 are overridden and the MOSFETs 86 and 88 are rendered conductive to provide a shunt across the series connected load 24 and load inductor 42. When the output 138-11 is driven from high to low, the LED of a logic gate optocoupler 146 is energized. As a result, output pin 146-6 of the optocoupler 146 is low. This output pin 146-6 is connected to the input pin 114-2 of the clamp MOSFET driver 114. When input pin 114-2 is low, output pin 114-7 is high, and the signal provided to the gate control terminal 92 renders the MOSFETs 86 and 88 of the clamp switching stage conductive.

If the overcurrent condition ends while the gates 138 and 136 are latched, the outputs 118-1 and 126-1 of the comparators 118 and 126 are both high. The input 136-9 of gate 136 goes from low to high. However, the input 136-10 remains high, and the state of the output 136-8 remains high throughout the remainder of the power on segment of the PWM duty cycle. During this latched interval, an overcurrent signal is continuously provided to the programmable controller 56 through output terminal 144, the series switching MOSFETs remain nonconductive and the clamp switching MOSFETs remain conductive.

The overcurrent protection system 23 is reset at the end of the power on segment of the PWM duty cycle. The optocoupler output 100-6 and the input 108-2 of the driver 108 go high at the end of the power on PWM segment. Gate inputs 140-1 and 140-2 go high, changing the output 140-3 and the input 138-13 from high to low. The output 138-11 goes high, and the overcurrent detection logic circuit 67 is returned to its initial, normal condition. Control is returned to the PWM control signal, and at the beginning of the next power on segment of the PWM duty cycle, the overcurrent protection system is set for continued detection of an additional overcurrent condition.

A power module package 150 of the dimmer 20 is seen in FIGS. 5-9. In general, the power module package includes a heat sink 152 together with the power switching stage 26 and the gate driver stage 54. The heat sink 152 has a flat, planar, rectangular upper surface 153. The power switching stage 26 includes a power circuit board structure with two separated ceramic circuit boards 154 and 156 separated by a central region 155 of the rectangular surface 153. The board 154 supports the MOSFETs 68 and 70 of the series switching section 44 in two adjacent corners of the rectangular surface 153. The board 156 supports the MOSFETs 86 and 88 of the clamp switching section 46 in the remaining two corners of the rectangular surface 153.

The heat sink 152 includes stepped side rails 158 supporting a gate driver section circuit board 160 spaced above the circuit boards 154 and 156 of the power switching stage 26. In some respects, the construction of the power module package may be similar to that described in U.S. patent application Ser. No. 10/457,067 filed on Jun. 6, 2003, issued on Feb. 1, 2005, as U.S. Pat. No. 6,849,943, incorporated herein by reference.

Figure 8:
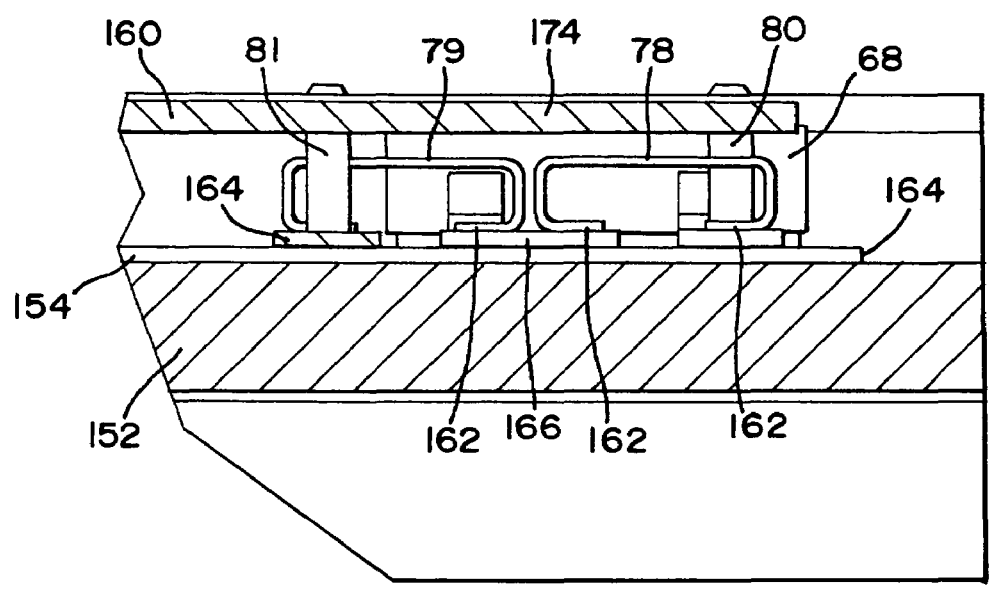
FIG. 8 is an enlarged cross sectional view taken along the line 8-8 of FIG. 6

The low resistance, interference resistant overcurrent link 65 is incorporated in the structure of the power module package 150. Current sensing resistors 78 and 79 are low inductance, thermally stable components such as Ohmite 60S series metal plate current sense resistors with a very low resistance value of, for example, 0.002 ohm. As seen in FIGS. 6 and 8 the resistors 78 and 79 are generally bridge shaped with spaced termination feet 162. The source terminals of the series switching MOSFETs 68 and 70 are soldered to conductive pads 164 bonded to the surface of the circuit board 154. A conductive ground pad 166 is bonded to the surface of the circuit board 154 between the conductive pads 164. The termination feet 162 of the current sensing resistors 78 and 79 are bonded by soldering to the pads 164 and 166, making direct connections to the output terminals of the MOSFETs 68 and 70.

The terminals 80, 81 and 77 are massive terminal posts having very low resistance. Conventional terminal pins and posts typically have a diameter, if round, or side dimension, if square, of about 0.025 inch. In the preferred embodiment of the invention, the terminal posts 80, 81 and 77 have a diameter of about 0.08 inch, and a cross sectional area about ten or twelve times greater than the cross sectional area of conventional terminal pins and posts. The massive posts 80, 81 and 77 contribute to the low electrical resistance and the lack of susceptibility to electromagnetic interference (EMI) of the signal link 65. Terminal posts with a diameter or side dimension of about 0.05 inch or larger are capable of achieving this result.

The power module package 150 includes a connector 168 (FIG. 6) for mating with an input/output (I/O) ribbon cable 170 (FIG. 5). Ribbon cable 170 provides a path for the transmission of signals between the gate driver stage 54 and the programmable controller 56. Those signals include the high frequency PWM series switching control signals provided to terminals 104 and 110 of the gate driver stage 54 (FIG. 4) and overcurrent signals provided to the programmable controller 56 from the output terminal 144 of the gate driver stage 54. A number of terminal pin wafer connectors 172 (FIG. 7) are mounted on the circuit boards 154 and 156 of the power switching stage 26. The terminal pins of connectors 172 connect to conductive traces of the gate driver circuit board 160 to provide the several additional connection terminals seen in FIG. 3.

Another aspect of the low resistance signal link 65 for the current signals sensed by resistors 78 and 79 is the location and layout of the gate driver circuit board 160. As can be seen by comparing FIGS. 6 and 7, it can be seen that the circuit board 160 includes a generally rectangular main portion 173 and a projecting tongue extension 174. The main portion 173 carries the MOSFET drivers 108 and 114 and other components of the gate driver stage 54. This main portion 173 is located above the central region 155 of the rectangular upper surface 153 of the heat sink 152. The MOSFETs 68, 70, 86 and 88 are located to the sides of the main board portion 173, reducing the transfer of heat to components of the gate driver stage 54.

The tongue portion 174 of the gate driver board 160 extends over the region between the MOSFETs 68 and 70 where the current sensing resistors 78 and 79 are located. The tongue 174 directly and closely overlies the resistors 78 and 79 and the massive terminal posts 77, 80 and 81. This has the advantage that very short conductive paths are needed to connect the current sensing resistors 78 and 79 to the circuit elements associated with the comparators 118 and 126 of the overcurrent protection logic section 67 of the gate driver stage 54. In the preferred embodiment of the invention, the distance between the top surface of the power stage circuit board 154 and the bottom surface of the gate driver circuit board 160 is less than about 0.5 inch and is about 0.25 inch. Thus the length of travel of the analog current sensing signal along the massive posts 77, 80 and 81 is minimized.

Figure 9:
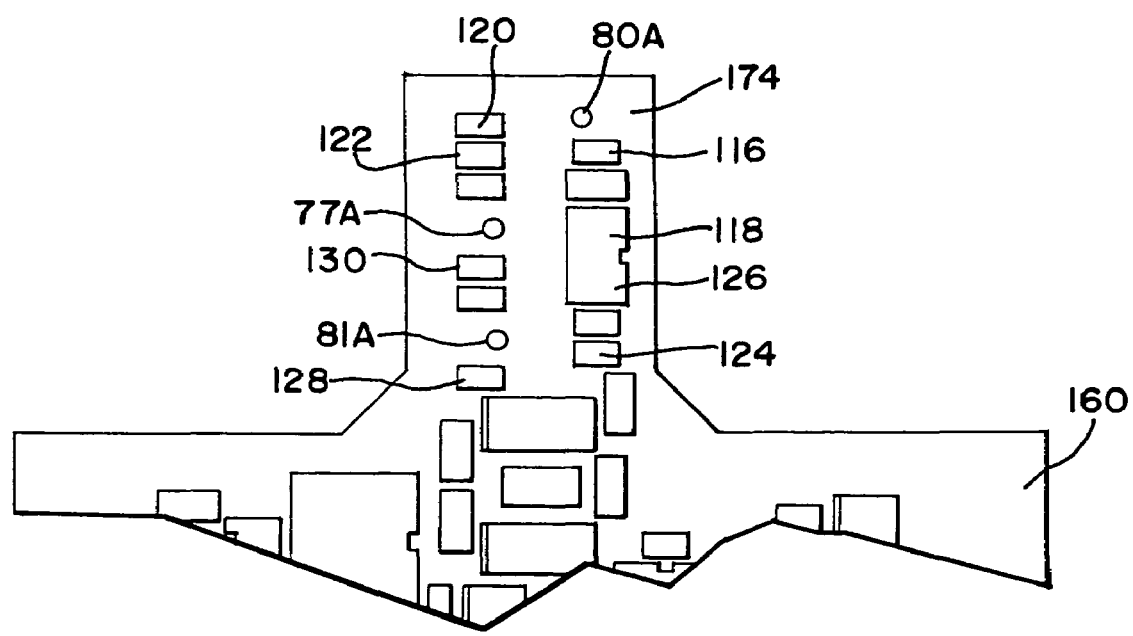
FIG. 9 is as fragmentary bottom plan view of the gate driver board.

The layout of components on the gate driver board 160 also contributes to the effectiveness of the signal link 65. Some circuit components and conductive paths are not seen in FIGS. 5-8 of the drawings for added clarity. FIG. 9 illustrates the component side, i.e. the bottom, of the extension 174 of the gate driver board 160. Hole 80A receives terminal post 80, hole 81A receives terminal post 81 and hole 77A. The terminal pins 77, 80 and 81 are solder connected to internal conductive paths (not seen) that extend to circuit components seen in FIG. 4.

The comparators 118 and 126 are in a single package that is located on the board extension 174 closely adjacent to the terminal posts 77, 80 and 81. Resistor 116 is immediately adjacent to the post 80, as are the voltage divider, threshold setting resistors 120 and 122. Similarly, the resistor 124 is close to the post 81, as are the threshold setting voltage divider resistors 128 and 130. Ground post 77 is centrally located between the posts 80 and 81, and also with respect to the comparators 118 and 126 and associated resistors. This component layout aids in minimizing sensing current path lengths, and reduces EMI coupling, even in the exceptionally electrically noisy environment resulting from the high power, high frequency switching of the series and clamp MOSFETs.

The digital portion of the overcurrent detection logic section 67, extending from the comparator outputs 118-1 and 126-1, processes digital high and low signals and is not highly susceptible to EMI. The low amplitude analog signal coupled across the link 65 from the current sensing resistors 78 and 79 to the comparator inputs 118-2 and 126-2 is potentially highly vulnerable to EMI induced errors. Such errors are avoided with the link 65 due to its robust, very low resistance structure and its very low inductance resulting from its extremely short length. The total current path length for analog signal travel from the current sensing resistor 78 or 79 to the corresponding comparator input is less than one inch, and in the illustrated embodiment, about three-quarters of an inch.

The immediate, temporary overcurrent protection shutdown performed by the overcurrent detection logic section 67 is supplemented by a durable overcurrent shutdown performed by the programmable controller 56. If an overcurrent condition is very brief, the hardware shutdown in logic section 67 can suffice alone to protect the solid state switches. The overcurrent protection routines implemented in software in the controller 56 serve to protect against longer lasting overcurrent conditions. In addition, the software routines protect against both concentrated and dispersed overcurrent conditions.

Figure 10:
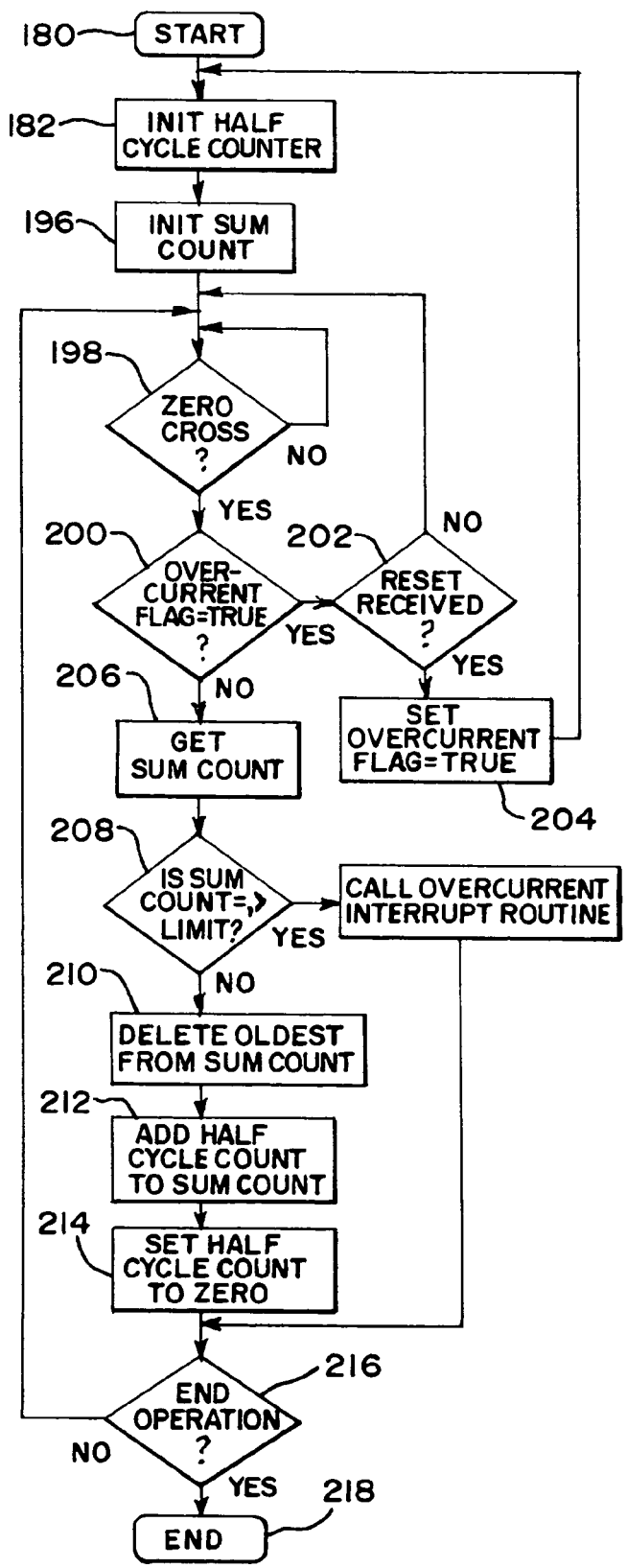
FIG. 10 is a flow chart of a routine performed by the programmable controller to process overcurrent signals from the overcurrent detection logic section; and performed by the programmable controller.

The microprocessor based programmable controller 56 under software and user control performs the routine illustrated in FIG. 10 to protect the solid state switches of the dimmer 20 from damage due to overcurrent conditions. This routine starts at block 180. At block 182 the counter 57 (FIG. 1) internal to the controller 56 is initiated. Overcurrent signals from output terminal 144 of the overcurrent detection logic circuit 67 are received at an input of the controller 56. The counter 57 is enabled to poll this input at a high frequency, for example five megahertz. At each instance of polling, if an overcurrent signal is present, the count is incremented by one. The count is repeated each half cycle of the power supply wave form. Initiation of the counter 57 includes setting the count to zero, and setting a limit variable to a total number of counts. The counter is enabled independently of the FIG. 10 routine to immediately command the overcurrent interrupt routine of FIG. 11 whenever the half cycle count reaches the limit value.

The half cycle count is reset to zero each half cycle of the power supply waveform. The count limit is set at a value for protecting the PWM dimmer switches from overcurrent damage during any half cycle of operation. This variable can be set by the user in programming the controller 56, and its value depends on various characteristics of the dimmer 20 and the load 24, among others. In the presently preferred embodiment of the invention the limit value is set at 4096.

Figure 11:
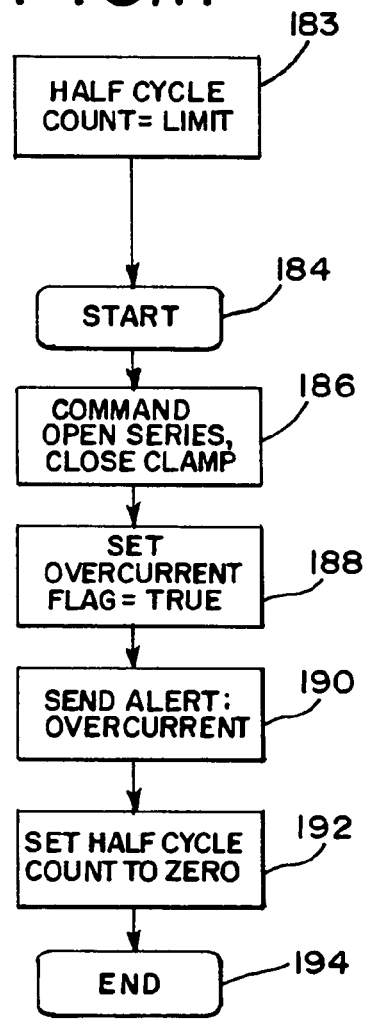
FIG. 11 is a flow chart of an overcurrent interrupt routine performed by the programmable controller.

As seen in FIG. 11, when the half cycle count reaches the limit value in any half cycle, as determined in block 183, the overcurrent interrupt routine starts at block 184 and a command is immediately sent at block 186 to the main PWM controlling routine of the controller 56. In accordance with this command, the series switching MOSFETs 68 and 70 are rendered nonconductive (open) and the clamp switching MOSFETs 86 and 88 are rendered conductive (close). Opening the MOSFETs 68 and 70 discontinues the flow of the excessive current sensed in the load circuit. Closing of the MOSFETs 86 and 88 limits voltage transient spikes that could otherwise cause damage.

An overcurrent flag is established in controller memory for indicating the software overcurrent status. In the absence of a sensed overcurrent condition the flag is set false. In block 188 of the overcurrent routine, the flag is set to true in order to indicate that an overcurrent condition exists. In block 190, an alert message is sent to the data input-output bus or device 58 for user information and action. In block 192, the counter 57 is reset to zero, and the overcurrent interrupt routine ends at block 194.

Programmable controller 56 includes a memory register for storing a sum of half cycle counts during a number of half cycles of the power supply wave form. Returning to the main overcurrent routine of FIG. 10, at block 196 this variable is initiated by selling it to zero. The immediate half cycle count responsive interrupt protects against concentrated overcurrent conditions, such as a short circuit, where essentially continuous overcurrent signals are received. Summing over a number of half cycles is used to protect against overcurrent conditions resulting in more intermittent overcurrent signals. The number of half cycles to be counted is determined by programming and can be selected to produce the desired result. In the presently preferred embodiment, the count is summed for sixteen half cycles.

Following the initialization procedures of blocks 182 and 196, the routine of FIG. 10 runs every half cycle of the power supply waveform. The main PWM routine of the controller 56 includes detection of zero crossings of the power supply waveform. Block 198 of FIG. 10 waits in a loop for each zero crossing before proceeding.

In response to an overcurrent alert, such as issued at block 190 of FIG. 11, the user may correct the cause of the overcurrent condition and send a reset signal to the controller 56 from the data input-output bus or device 58. The reset may take any desired form. In the presently preferred embodiment of the invention, a reset signal consists of an instruction for a zero magnitude dimmer output for a duration of at least one half second. Following each zero crossing, at block 200 of FIG. 10, the overcurrent flag is interrogated. If the overcurrent flag is true and solid state switching is in a shutdown state, then at block 202 the routine checks for a user reset signal. If no reset is received at block 202, the routine returns to block 198 and the overcurrent flag is checked each half cycle. If a reset signal is received at block 202, the overcurrent flag is set to false at block 204 and the routine returns to reinitialize at block 182.

If the overcurrent flag is false at block 200, and no software overcurrent condition exists, the routine advances to block 206. In this block the stored sum half cycle counts for sixteen half cycles is obtained. In block 208 this sum is compared to a maximum value. This maximum value may be the same as the limit value used in block 183 of the FIG.

11 for the half cycle count limit, or it may have a different value. In the presently preferred embodiment, the same count value of 4096 is used.

If the sum count obtained in block 206 is less than the sum count limit value, then at block 210 the half cycle count of the oldest half cycle is removed from the sum count value. In block 212, the sum count is updated with the current half cycle count value from the counter 57. Then in block 214, the counter 57 is reset to zero. Decision block 216 is included to represent a way for the controller 56 to discontinue the routine of FIG. 10, for example in the event of powering down of the dimmer 20. If the dimmer switching operation is ending, the routine terminates at end block 218, and if not, the half cycle routine returns to block 198 and repeats.

The PWM frequency of thousands of hertz is large compared to the 60 hertz power supply frequency. For every half cycle of the power supply wave form, there are hundreds of PWM duty cycles; somewhat over 400 in the preferred embodiment. The hardware overcurrent shutdown performed by the overcurrent detection logic section 67 terminates and resets at the end of the present power on duty cycle segment. This extremely fast, short duration hardware shutdown mode makes the operation of the dimmer substantially impervious to very brief overcurrent anomalies. For example, during a cold filament startup of an incandescent lamp, a limited number of overcurrent conditions can exist as the filament heats. Hardware overcurrent shutdowns can occur in small numbers near the high amplitude, central parts of some half cycles, without reaching the half cycle limit counts or sum limit counts resulting in a software shutdown. This allows an anomaly such as a transient cold filament condition to be tolerated until normal steady state operation is achieved.

The half cycle count occurs at a much higher frequency than the PWM frequency, and the counter 57 interrogates for overcurrent signals many times during each PWM cycle. In the presently preferred arrangement, there are about 100 counter interrogations in each PWM cycle, and many thousands of counter interrogations in each power supply half cycle. In the event of a short circuit or substantially continuous overcurrent condition, only about 0.8 milliseconds, or about one-tenth of a power half cycle, is required for the half cycle count to reach the limit value of $2^{12}$ (4096). This produces a durable, software overcurrent shutdown that protects the solid state dimmer switches by remaining effective until the cause of the overcurrent condition can be corrected and a user reset signal is received.

Solid state switches can be harmed not only by substantially continuous overcurrent, but also by intermittent conditions that result in interspersed overcurrents that cumulate in damage. Use of a sum count over a series of half cycles protects against this type of overcurrent condition even if the count in any single half cycle does not result in a software shutdown.

While the present invention has been described with reference to the details of the embodiment of the invention shown in the drawing, these details are not intended to limit the scope of the invention as claimed in the appended claims.

What is claimed is:

1. A PWM switching power supply with overcurrent protection, said power supply receiving AC power from a power source and providing output current for powering a load, said PWM switching power supply comprising:

a series switching section having a series solid state switch in series with the load, and a clamp switching section shunting the load;

a programmable controller supplying a PWM control signal having a duty cycle with power on segments;

a driver system receiving said PWM control signal and providing PWM operating signals for alternate conduction of said series and clamp switching sections;

a current sensing resistor connected to said series solid state switch and sensing output current during power on cycles;

a comparator connected to said current sensing resistor for comparing sensed output current with a threshold value and providing an overcurrent indication if the output current exceeds the threshold value in a PWM power on duty cycle segment;

a logic circuit for overriding said driver system and rendering said series switching section nonconductive and rendering said clamp switching section conductive in response to said overcurrent indication;

an optocoupler connected to said logic circuit for providing an overcurrent signal in response to said overcurrent indication;

said logic circuit returning said driver circuit to PWM control following said PWM power on duty cycle segment said controller having an input connected to said optocoupler for receiving said overcurrent signal;

said controller having a counter programmed to poll said input with a clock frequency and to hold a count of instances of the presence of the overcurrent signal at the input during a predetermined time interval; and said controller having an interrupt routine for discontinuing said PWM control signals, holding said series solid state switch non conductive and holding said clamp switching section conductive in response to said count reaching a limit value.

2. The PWM switching power supply of claim 1, said controller having a summing routine for summing said count for a predetermined number of said time intervals and calling said interrupt routine if the sum reaches a maximum value.

3. The PWM switching power supply of claim 1, said series solid state switch being a high power, high frequency solid state switch, namely a MOSFET or an IGBT.

4. The PWM switching power supply of claim 3, said series solid state switch being a MOSFET.

5. A PWM power supply with overcurrent protection, said power supply providing output current for powering a load, said PWM power supply comprising:

at least one high power, high frequency solid state series switching device connected in series with the load and switching the output current on and off;

an output current sensing resistor connected in series with the series switching device;

an overload detection logic section;

a circuit link connecting said current sensing resistor to said logic section;

said logic section including a first circuit operable to an overcurrent state in response to a sensed output current exceeding a threshold amplitude;

said logic section having a second circuit for rendering said series switching device nonconductive in response to operation of said first circuit to said overcurrent state a power circuit board supporting said series switching device;

said current sensing resistor being mounted on said power circuit board;

a driver circuit board;

said logic system being mounted on said driver circuit board; and said circuit link extending between said power and driver circuit boards said first circuit including a comparator having a first input for receiving a threshold value and a second input for receiving an analog signal from said current sensing resistor through said circuit link, and said driver circuit board being mounted parallel to said power circuit board, and said first circuit on said driver circuit board overlying said current sensing resistor on said power circuit board.

6. The PWM power supply of claim 5 further comprising a driver chip mounted on said driver circuit board for sending PWM power on duty cycle segment operating signals to said series switching device;

a third circuit on said driver circuit board for transferring PWM duty cycle control signals to said driver chip; and said second circuit overriding said duty cycle control signals in response to operation of said first circuit to said overcurrent state.

7. The PWM power supply of claim 5, said driver circuit board being spaced from said power circuit board by a distance of less than about one-half inch.

8. The PWM power supply of claim 5, said circuit link including a massive terminal post extending between said power circuit board and said driver circuit board.

9. The PWM power supply of claim 8, said massive terminal post having a cross sectional area of at least about 0.05 inch.

10. The PWM power supply of claim 5, said circuit link forming an analog signal path from said current sensing resistor to said first circuit, said signal path having a length of less than about one inch.

11. A method for overcurrent protection of a solid state PWM switching sinewave dimmer power supply, said method comprising:

operating first and second series solid state switches in accordance with a PWM control signal;

operating a clamp switch section in accordance with the inverse of the PWM signal;

sensing current in the power supply by detecting current during positive half cycles of a power source waveform with a first sensing resistor connected to an output terminal of the first series solid state switch of the power supply and detecting current during negative half cycles of the power source waveform with a second sensing resistor connected to an output terminal of the second series solid state switch of the power supply;

comparing the sensed current with a threshold value;

producing an overcurrent indication if the sensed current exceeds the threshold value;

removing the first and second series solid state switches from PWM control and switching the first and second series solid state switches to a nonconductive condition in response to the overcurrent indication;

removing the clamp switch section from inverse PWM control and switching the clamp switch section to a conductive condition in response to the overcurrent indication;

returning the first and second series solid state switches to PWM control and returning the clamp switch section to inverse PWM control at the end of the current power on segment of the PWM control signal;

providing an overcurrent signal to an input of a microprocessor based programmable controller in response to the overcurrent indication, said providing step including transferring the overcurrent signal through an optocoupler; and polling the controller input with a clock frequency and holding a count of instances of the presence of the overcurrent signal at the input during a predetermined time interval.

12. A method as claimed in claim 11 wherein the clock frequency is faster than the frequency of the PWM control signal.

13. A method as claimed in claim 11 further comprising shutting down the sinewave dimmer power supply if the count reaches a limit.

14. A method as claimed in claim 13 further comprising maintaining a sum of the counts for a predetermined number of time intervals and shutting down the sinewave dimmer power supply if the sum reaches a maximum.

15. A method for overcurrent protection of a solid state PWM switching power supply, said method comprising:

switching a solid state switch on and off in accordance with a PWM control signal having power on segments;

sensing current in the solid state switch;

providing an overcurrent indication if the sensed current exceeds a threshold value in a power on segment;

overriding the PWM control signal and switching off the solid state switch for the duration of said power on segment in response to the overcurrent indication;

reinstating the PWM control signal after said power on segment;

counting instances of the overcurrent indications and shutting down the PWM power supply if the count reaches a limit during a time interval; and summing the count for a predetermined number of time intervals and shutting down the PWM power supply if the sum reaches a maximum.

16. The method of claim 15 further comprising, after shutting down of the PWM power supply, reinstating the PWM control signal in response to a reset signal.

17. A method for overcurrent protection as claimed in claim 15 wherein the time interval is one half cycle of the AC source.

18. A method for overcurrent protection as claimed in claim 17 wherein the predetermined number of time intervals is sixteen.

* * * * *

UNITED STATES PATENT AND TRADEMARK OFFICE
CERTIFICATE OF CORRECTION

PATENT NO. : 7,369,386 B2  Page 1 of 1
APPLICATION NO. : 11/048123
DATED : May 6, 2008
INVENTOR(S) : Rasmussen et al.

It is certified that error appears in the above-identified patent and that said Letters Patent is hereby corrected as shown below:

In the Specification:

Col. 4, line 42   Please delete the word "damp" and insert --clamp-- in its place.

Col. 4, line 45   Please delete "switching section 46 44", and insert --switching section 46-- in its place.

Signed and Sealed this

Seventh Day of July, 2009

JOHN DOLL
*Acting Director of the United States Patent and Trademark Office*